(12) United States Patent
Jung

(10) Patent No.: US 9,459,395 B2
(45) Date of Patent: Oct. 4, 2016

(54) BACKLIGHT ASSEMBLY AND LIQUID CRYSTAL DISPLAY INCLUDING THE SAME

(71) Applicant: LG Display Co., Ltd., Seoul (KR)

(72) Inventor: MyungWoo Jung, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 52 days.

(21) Appl. No.: 14/584,885

(22) Filed: Dec. 29, 2014

(65) Prior Publication Data
US 2015/0241618 A1    Aug. 27, 2015

(30) Foreign Application Priority Data

Feb. 27, 2014   (KR) .................. 10-2014-0023591

(51) Int. Cl.
*F21V 8/00*   (2006.01)
*H05K 1/18*   (2006.01)

(52) U.S. Cl.
CPC ............ *G02B 6/0031* (2013.01); *G02B 6/005* (2013.01); *G02B 6/0091* (2013.01); *H05K 1/189* (2013.01); *H05K 2201/10106* (2013.01); *H05K 2201/10136* (2013.01)

(58) Field of Classification Search
None
See application file for complete search history.

(56) References Cited

U.S. PATENT DOCUMENTS

2008/0043171 A1* 2/2008 Takahashi ............ G02B 6/0083
349/65
2012/0257414 A1* 10/2012 Park ..................... G02B 6/0068
362/611
2013/0021782 A1 1/2013 Yan et al.

FOREIGN PATENT DOCUMENTS

TW    I224183 B      11/2004
TW    201305667 A    2/2013

OTHER PUBLICATIONS

Taiwan Office Action, Taiwan Application No. 103145317, Apr. 12, 2016, 9 pages (with concise explanation of relevance).

* cited by examiner

*Primary Examiner* — Ashok Patel
(74) *Attorney, Agent, or Firm* — Fenwick & West LLP

(57) ABSTRACT

A backlight assembly capable of preventing light leakage and a liquid crystal display (LCD) device including the same are provided. The backlight assembly includes a light source unit, a light guide plate, a light conversion sheet, and a reflective tape. The light source unit including one or more light emitting diodes (LEDs) mounted on a flexible printed circuit board (FPCB). The light guide plate is disposed to be adjacent to the light source unit. The light conversion sheet is disposed on the light guide plate and spaced apart from the FPCB, and configured to convert a wavelength band of light provided through the light guide plate from the light source unit, the light conversion sheet configured to emit white light. The reflective tape is attached to extend from a portion of an upper surface of the FPCB to a portion of an upper surface of the light conversion sheet.

14 Claims, 3 Drawing Sheets

BACKLIGHT ASSEMBLY AND LIQUID CRYSTAL DISPLAY INCLUDING THE SAME

CROSS-REFERENCE TO RELATED APPLICATION

Pursuant to 35 U.S.C. §119(a), this application claims the benefit of earlier filing date and right of priority to Korean Application No. 10-2014-0023591, filed on Feb. 27, 2014, the contents of which is incorporated by reference herein in its entirety.

BACKGROUND

1. Technical Field

The present disclosure relates to a backlight assembly and, more particularly, to a backlight assembly capable of obtaining uniform white light, while preventing light leakage; and a liquid crystal display device including the same.

2. Background

A flat panel display (FED) is an improved display device for use in compact, lightweight systems including portable computers such as notebook computers, PDAs, and the like, or portable mobile terminals, and the like, as well as monitors of desktop computers; and replaces conventional cathode ray tube (CRT) display devices.

Currently commercialized flat panel display devices include a liquid crystal display (LCD), a plasma display panel (PDP), an organic light emitting display device, and the like. Thereamong, an LCD used in mobile devices, computer monitors, HDTVs, and the like, has gained prominence due to its advantages such as excellent visibility, ease of a reduction in thickness, low power consumption, a low level of heating, and the like.

An LCD includes a liquid crystal panel including two substrates attached with a liquid crystal layer interposed therebetween, and a backlight assembly providing light from a lower side of the liquid crystal panel.

The backlight assembly uses a cold cathode fluorescent lamp (CCFL), an external electrode fluorescent lamp (EEFL), a light emitting diode (LED), and the like. Thereamong, the LED, having the characteristics such as compactness, low power consumption, high reliability, and the like, is widely used as a light source for displays.

Recently, in order to enhance color gamut (or color reproduction range) of LCDs, a blue LED, replacing a general white LED, is used as a light source of a backlight assembly. Also, a separate optical conversion sheet for converting blue light emitted from a blue LED into white light is provided.

FIG. 1 is a view illustrating a related art LCD device, and FIG. 2 is an enlarged view of a portion 'A' of FIG. 1.

Referring to FIG. 1, the related art LCD 1 includes a liquid crystal panel 10, a backlight assembly, and receiving containers for receiving the liquid crystal panel 10 and the backlight assembly, for example, a support main 35, and a bottom cover 30.

The liquid crystal panel 10 has a structure in which two substrates 11 and 13 are attached with a predetermined gap therebetween, and a liquid crystal layer (not shown) is interposed between the two substrates 11 and 13. The liquid crystal panel 10 displays an image as optical characteristics of the liquid crystal layer are changed according to an electric field formed between the two substrates 11 and 13. The liquid crystal panel 10 is driven upon receiving a signal by a driving circuit (not shown) connected to one of the two substrates 11 and 13.

The backlight assembly is disposed below the liquid crystal panel 10 and supplies light to the liquid crystal panel 10. The backlight assembly includes light sources 27 and 28, a light guide plate 25, a light conversion sheet 23, an optical sheet 21, and a reflective sheet 26.

The plurality of blue LEDs 27 and a flexible printed circuit board (FPCB) 28 together form and are referred to herein as a light source. The light sources 27 and 28 include a plurality of blue LEDs 27 and a flexible printed circuit board (FPCB) 28 on which the blue LEDs 27 are mounted. The light sources 27 and 28 emit blue light from the blue LEDs 27.

The light guide plate 25 is disposed to be adjacent to the light sources 27 and 28, and emit blue light, which is incident through a light entrance surface from the light sources 27 and 28, upwardly, namely, through a light exit surface.

The reflective sheet 26 is disposed on a rear surface of the light guide plate 25, and reflects light, which travels to a lower side of the light guide plate 25 from the light sources 27 and 28, to an upper side of the light guide plate 25. The term 'upper side' is used herein to refer to a side which faces or is proximal to the light emitting side of the LCD. The term 'upper surface' is used herein to refer to a surface that faces the light emitting side of the LCD. The term 'lower surface' refers to a surface that is opposite to the 'upper surface' or faces away from the light emitting side of the LCD.

The light conversion sheet 23 is disposed on an upper surface of the light guide plate 25 and converts blue light emitted from the light guide plate 25 into white light.

The light conversion sheet 23 may include a plurality of quantum dots therein, and a wavelength of blue light provided from the light guide plate 25 is selectively converted by the quantum dots to emit red light and green light. The red light and green light wavelength-converted together with blue light provided from the light guide plate 25 are mixed within (or collectively emitting from) the light conversion sheet 23, thus finally emitting white light.

The optical sheet 21 is disposed on the light conversion sheet 23 and diffuses and concentrates white light output from the light conversion sheet 23. The optical sheet 21 includes one or more prism sheets, and light diffused and concentrated by the optical sheet 21 is provided to a rear surface of the liquid crystal panel 10.

The backlight assembly including the foregoing components are accommodated in the bottom cover 30, and fixed by the support main 35. The liquid crystal panel 10 is disposed on the support main 35. Also, a top cover (not shown) is coupled to the bottom cover 30 from an upper side of the liquid crystal panel 10, thus completing the LCD device 1.

As shown in the portion 'A' of FIG. 1, in the related art LCD device 1, the light conversion sheet 23 and the FPCB 28 are disposed to be spaced apart from one another by a predetermined gap on an upper surface of the light guide plate 25. Thus, light emitted from the blue LED 27 is leaked outwardly through the exposed upper surface of the light guide plate 25, causing a light leakage phenomenon.

That is, as illustrated in FIG. 2, the blue LED 27 of the light sources 27 and 28 emit light in a plurality of directions, and the emitted light is incident through the light entrance surface of the light guide plate 25 and reflected and refracted to travel within the light guide plate 25. The light which has travelled to the interior of the light guide plate 25 is emitted upwardly through the light exit surface of the light guide plate 25.

Here, when the light emitted from the blue LED 27 is incident to the light entrance surface of the light guide plate 25 at an accurate incident angle (B), the incident light is reflected and refracted within the light guide plate 25 so as to be emitted to the light exit surface where the light guide plate 25 and the light conversion sheet 23 overlap with each other. The light conversion sheet 23 converts light provided from the light guide plate 25, namely, blue light, into white light and provides the white light to the optical sheet 21.

However, if light emitted from the blue LED 27 is incident to the light entrance surface of the light guide plate 25 at an inaccurate incident angle (B'), the incident light is reflected and refracted within the light guide plate 25 so as to be output outwardly through the exposed upper portion of the light guide plate 25.

Thus, in the related art LCD device 1, since the FPCB 28 and the light conversion sheet 23 are disposed to be spaced apart from one another by a gap on the light guide plate 25, light emitted from the blue LED 27 is leaked outwardly through the exposed upper portion of the light guide plate 25, causing light leakage.

The light leakage causes a bluish appearance on one side of the liquid crystal panel, which results in a defective screen image of the LCD device 1.

SUMMARY

Therefore, an aspect of the detailed description is to provide a backlight assembly capable of improving light leakage, and a liquid crystal display device including the same.

To achieve these and other advantages and in accordance with the purpose of this specification, as embodied and broadly described herein, a backlight assembly may include: a light source unit including one or more light emitting diodes (LEDs) mounted on a flexible printed circuit board (FPCB); a light guide plate disposed to be adjacent to the light source unit and disposed to be in contact with the FPCB in a portion of an upper surface thereof; a light conversion sheet disposed on the light guide plate and spaced apart from the FPCB, and configured to selectively convert a wavelength band of light provided through the light guide plate from the light source unit to emit white light; and a reflective tape attached to extend from a portion of an upper surface of the FPCB to a portion of an upper surface of the light conversion sheet.

According to embodiments of the present disclosure, since a reflective tape is attached to an upper portion of a light guide plate to reflect light leaked through an upper surface of a light guide plate, light leakage can be prevented.

Also, when a blue LED is used in a light source unit, a phenomenon in which blue light having high strength is emitted from a portion where the light source unit is adjacent to the light guide plate, preventing emission of uniform white light from a light conversion sheet, can be prevented, and thus, white light having a high color gamut can be obtained.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the disclosure.

In the drawings.

DETAILED DESCRIPTION OF THE INVENTION

Description will now be given in detail of the exemplary embodiments, with reference to the accompanying drawings. For the sake of brief description with reference to the drawings, the same or equivalent components will be provided with the same reference numbers, and description thereof will not be repeated.

Hereinafter, a backlight assembly and a liquid crystal display (LCD) device according to an embodiment of the present disclosure will be described in detail with reference to the accompanying drawings.

Figure 1:
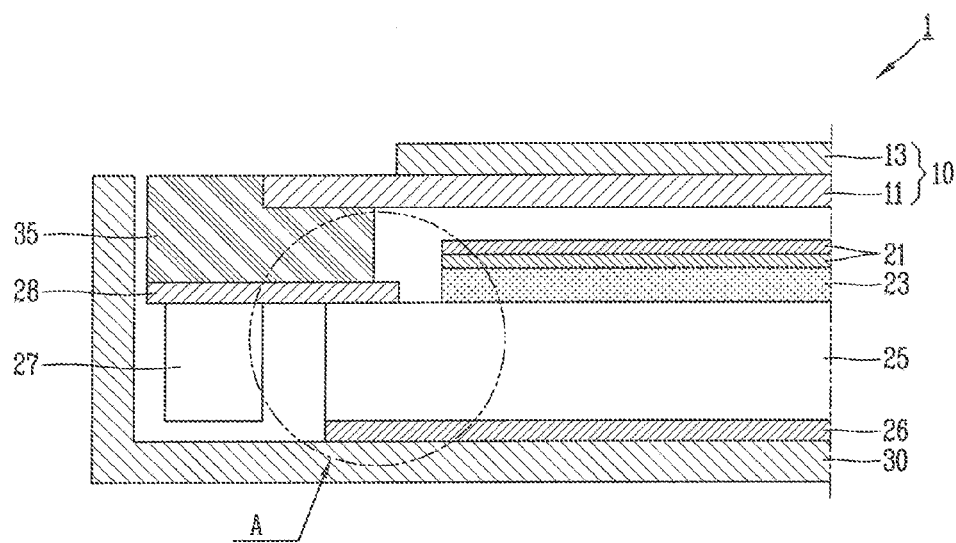
FIG. 1 is a view illustrating the related art liquid crystal display (LCD) device.
Figure 2:
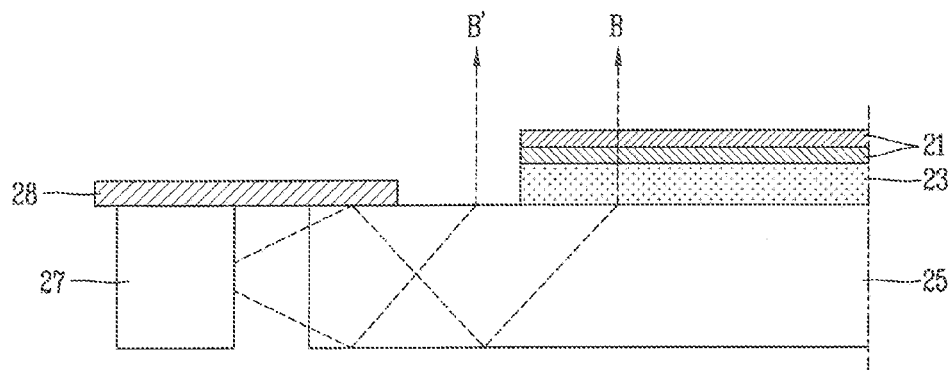
FIG. 2 is an enlarged view of a portion 'A' of FIG. 1.
Figure 3:
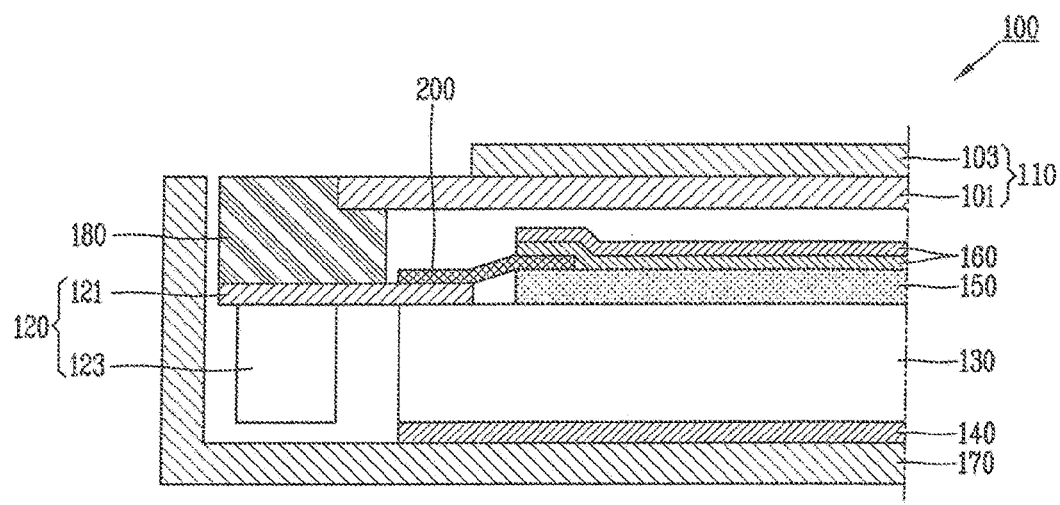
FIG. 3 is a view illustrating an LCD device according to an embodiment of the present disclosure.

FIG. 3 is a view illustrating an LCD device according to an embodiment of the present disclosure.

Referring to FIG. 3, an LCD device 100 according to an embodiment of the present disclosure may include a liquid crystal panel 110, a backlight assembly, and receiving containers, for example, a support main 180, and a bottom cover 170.

The liquid crystal panel 110 displays an image and includes a first substrate 101 and a second substrate 103 attached in a facing manner with a liquid crystal layer (not shown) interposed therebetween.

The first substrate 101 called a lower substrate or an array substrate includes pixels defined which are defined where gate lines and data lines intersect each other, and thin film transistors (TFT) are provided at intersections of the gate lines and the data lines and connected to pixel electrodes formed in the pixels, respectively.

The second substrate 103 called an upper substrate or a color filter substrate includes red, green, and blue color filters corresponding to the pixels of the first substrate 101. A black matrix is provided to cover outer edge portions of the color filters and cover non-display elements such as the gate lines, the data lines, or the TFTs of the first substrate 101. A transparent common electrode is formed above the color filters and the black matrix.

Also, although not shown, polarizers (not shown) allowing only particular light to be selectively transmitted therethrough are attached to the first substrate 101 and the second substrate 103.

A printed circuit board (PCB) (not shown) may be connected to the liquid crystal panel 110 by the medium of a connection member (not shown) connected to at least one edge of the liquid crystal panel 110, for example, a flexible printed circuit board (FPCB), or a tape carrier package (TCP). The PCB may be disposed to be bent to receiving containers described hereinafter, namely, the side of the support main 180, or a rear surface of a bottom cover 170.

A backlight assembly may be disposed below the liquid crystal panel 110 to supply light to the liquid crystal panel 110. The backlight assembly may include a light source unit 120, a light guide plate 130, a reflective sheet 140, a light conversion sheet 150, and an optical sheet 160.

The light source unit 120 may include a plurality of LEDs 123 and an FPCB 121 on which the plurality of LEDs 123 are mounted.

The plurality of LEDs 123 may be mounted on the FPCB 121 and spaced apart from one another by a predetermined gap. The LEDs 123 may be blue LEDs emitting blue light or infrared LEDs.

A plurality of lines may be formed on the FPCB 121, and a driving voltage may be supplied to each of the plurality of LEDs 123 through the plurality of lines. A portion of the FPCB 121 may overlap with a portion of an upper surface of the light guide plate 130.

The light guide plate 130 may be disposed to be adjacent to the light source unit 120. The light guide plate 130 may guide light, which is incident through a light entrance surface from the light source unit 120, to an upper surface, namely, a light exit surface, so as to be evenly spread to the entire region of the liquid crystal panel 110. In other words, light incident to the light guide plate 130 from the light source unit 120 is reflected and refracted within the light guide plate 130 and emitted outwardly through the light exit surface.

Meanwhile, various patterns, for example, an oval pattern, a polygonal pattern, or a hologram pattern may be formed on the light guide plate 130 in order to guide incident light. Such a pattern may be formed on a rear surface of the light guide plate 130 in a printing or an injection molding manner.

The reflective sheet 140 is disposed on a rear surface of the light guide plate 130 and reflects light, which has passed through the rear surface of the light guide plate 130, to an upper side of the light guide plate 130 to improve luminance.

The light conversion sheet 150 may be disposed on an upper surface of the light guide plate 130. The light conversion sheet 150 may be configured to selectively convert light provided through the light guide plate 130 from the light source unit 120 into light having a particular wavelength band, and collectively emit (or mix) light having different wavelength bands to collectively give the visual appearance of white light.

The light conversion sheet 150 may include a plurality of quantum dots therein and convert a wavelength band of incident light by the quantum dots.

A quantum dot refers to a particle having a predetermined size and having a quantum confinement effect. A quantum dot may have a size ranging from about 2 nm to 15 nm. A quantum dot may be composed of a central body and a shell of zinc sulfide (ZnS), and the central body may be formed of a cadmium selenide (CdSe), a cadmium telluride (CdTe), a cadmium sulfide (CdS).

A quantum dot generates strong fluorescence in a narrow wavelength band, and fluorescence emitted from a quantum dot has a wavelength band which is varied depending on a particle size of the quantum dot. For example, as the particle size of a quantum dot is reduced, light having a short wavelength is generated, and as the particle size of a quantum dot is increased, light having a long wavelength is generated.

Thus, the light conversion sheet 150 may convert light provided from the light guide plate 130 into light having various wavelength bands by the quantum dots therein, and the converted light may be mixed within the light conversion sheet 150 to emit white light having a high color gamut.

Figure 4:
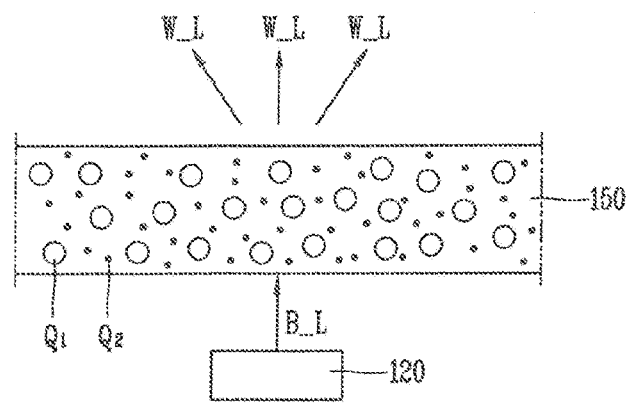
FIG. 4 is a view illustrating a configuration of a light conversion sheet illustrated in FIG. 3, according to an embodiment of the present disclosure.

FIG. 4 is a view illustrating a configuration of the light conversion sheet illustrated in FIG. 3.

Referring to FIGS. 3 and 4, the light conversion sheet 150 includes quantum dots having different sizes therein. For example, the light conversion sheet 150 may include a first quantum dot Q1 and a second quantum dot Q2.

The first quantum dot Q1 and the second quantum dot Q2 have different sizes and convert incident light into light having different wavelengths.

For example, when the LED 123 of the light source unit 120 is formed as a blue LED, the light guide plate 130 may emit blue light B_L provided from the light source unit 120. The blue light B_L emitted from the light guide plate 130 may be provided to the light conversion sheet 150, and the first quantum dot Q1 of the light conversion sheet 150 may absorb the blue light B_L and convert a wavelength band thereof to emit red light. Also, the second quantum dot Q2 of the light conversion sheet 150 may absorb the blue light B_L and convert a wavelength band thereof to emit green light.

Accordingly, the light conversion sheet 150 may mix or collectively emit the blue light B_L provided from the light source unit 120, along with the green light and red light wavelength-converted from the blue light B_L therein, together to emit white light W_L.

Meanwhile, when the LED 123 of the light source unit 120 is formed as an ultraviolet LED, the light conversion sheet 150 may further include a third quantum dot (not shown) having a different particle size together with the first quantum dot Q1 and the second quantum dot Q2 described above.

The first quantum dot Q1 and the second quantum dot Q2 of the light conversion sheet 150 may absorb light provided through the light guide plate 130, and convert a wavelength band thereof to emit red light and green light. Also, the third quantum dot of the light conversion sheet 150 may absorb light provided through the light guide plate 130 and convert a wavelength band thereof to emit blue light.

Accordingly, the light conversion sheet 150 may mix the green light, red light, and blue light generated by converting a wavelength of light provided from the light source unit 120 therein to emit white light W_L.

Referring back to FIG. 3, the foregoing light conversion sheet 150 may be formed on the upper surface of the light guide plate 130 and spaced apart from one side of the FPCB 121 of the light source unit 120. Accordingly, a portion of the upper surface of the light guide plate 130 is exposed outwardly, and light emitted from the light source unit 120 is leaked through the exposed portion.

Thus, the LCD device 100 according to an embodiment of the present disclosure may include a reflective tape 200 covering the exposed upper surface of the light guide plate 130.

The reflective tape 200 may be attached to extend from one side of the FPCB 121 overlapping with the light guide plate 130 to one side of the light conversion sheet 150, covering the exposed upper surface of the light guide plate 130.

The reflective tape 200 may reflect light, which is emitted through the exposed upper surface of the light guide plate 130 from the light source unit 120, to the light guide plate 130. Light reflected from the reflective tape 200 may be reflected and refracted within the light guide plate 130 again so as to be incident on the light conversion sheet 150.

Accordingly, in the present embodiment, a light leakage phenomenon in which light emitted from the light source unit 120 is leaked through the exposed upper surface of the light guide plate 130 may be prevented.

Also, the reflective tape 200 may reflect light, which is emitted through one side of the light conversion sheet 150, for example, one side of the light conversion sheet 150 overlapping with the reflective tape 200, again to the light conversion sheet 150. When light reflected from the reflective tape 200 is incident again into the light conversion sheet 150, the re-incident light is optionally wavelength-converted and emitted together with the remainder of the light incident on the light conversion sheet 150 so as to be emitted together as uniform white light.

The foregoing reflective tape 200 may be a single sided coated tape having a dual-layer structure in which an adhesive layer is formed only in a portion which is in contact with the FPCB 121, the light guide plate 130, and the light conversion sheet 150.

Figure 5:
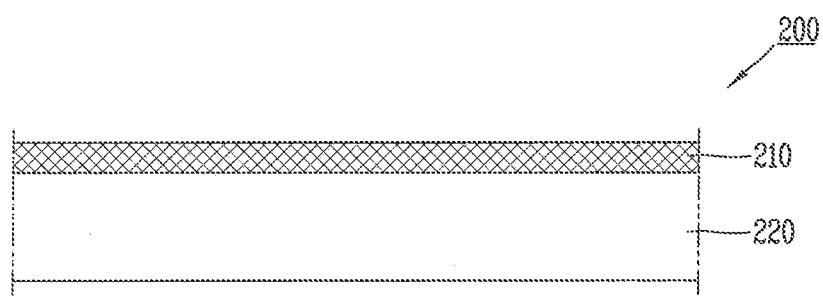
FIG. 5 is a view illustrating a configuration of a reflective tape illustrated in FIG. 3, according to an embodiment of the present disclosure.

FIG. 5 is a view illustrating a configuration of the reflective tape illustrated in FIG. 3.

Referring to FIGS. 3 and 5, the reflective tape 200 may include a black blocking layer 210 and a white reflective layer 220. Also, an adhesive layer (not shown) may be formed in the reflective tape 200.

The reflective layer where the adhesive layer is formed in the reflective tape 200 may be attached to the FPCB 121, the light guide plate 130, and the light conversion sheet 150. The reflective layer 220 may reflect light, which is emitted through the exposed upper surface of the light guide plate or through one side of the light conversion sheet 150, again to the light guide plate 130 or the light conversion sheet 150.

Figure 6:
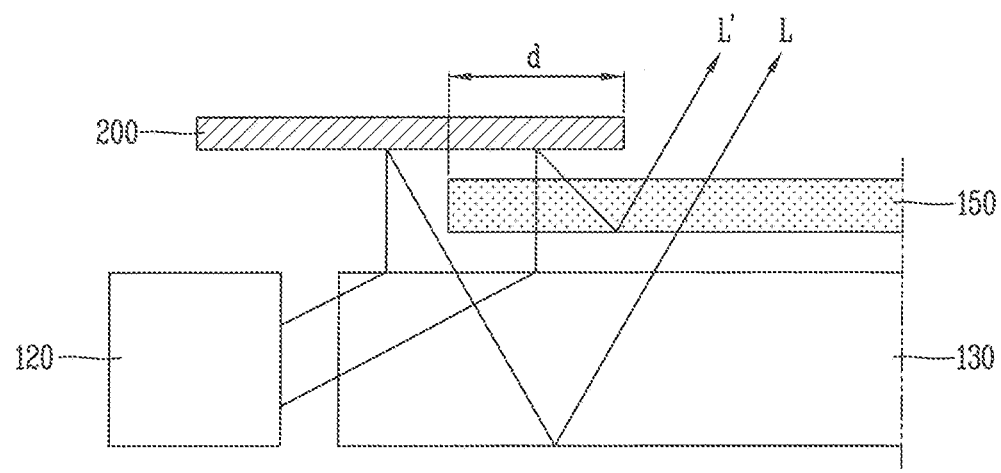
FIG. 6 is a view illustrating optical paths in the LCD device according to an embodiment of the present disclosure.

FIG. 6 is a view illustrating optical paths in the LCD device according to an embodiment of the present disclosure.

Referring to FIGS. 3 and 6, among light emitted from the LED 123 of the light source unit 120, light L emitted through the exposed upper surface of the light guide plate 130 is reflected from the reflective tape 200 and incident into the interior of the light guide plate 130.

Subsequently, the light L incident into the interior of the light guide plate 130 is reflected and refracted within the light guide plate 130 and subsequently emitted as white light through the light conversion sheet 150.

Here, the light L incident to the interior of the light guide plate 130 by the reflective tape 200 may be reflected again by the reflective sheet 140 disposed below the light guide plate 130 and provided to the light conversion sheet 150.

Thus, a light leakage phenomenon in which light emitted from the light source unit 120 is emitted outwardly through the exposed upper surface of the light guide plate 130 may be prevented. In particular, in the present embodiment, in a case in which a blue LED is used as the LED 123 of the light source unit 120, a phenomenon in which one side of the liquid crystal panel 110 becomes bluish due to leakage of blue light emitted from the blue LED can be prevented.

Also, among light emitted from the LED 123 of the light source unit 120, light L' emitted through the light conversion sheet 150 is reflected from the reflective tape 200 so as to be incident to the interior of the light conversion sheet 150.

Subsequently, the light L' incident to the interior of the light conversion sheet 150 is wavelength-converted and emitted together with the remainder of the light within the light conversion sheet 150 and emitted together as white light.

That is, in the present embodiment, where a blue LED is used as the LED 123 of the light source unit 120, a light leakage phenomenon in which blue light having high strength is leaked or emitted from a portion where the LED 123 and the light guide plate 130 are adjacent, can be prevented. This obviates the problem where the light conversion sheet 150 is prevented from emitting uniform white light. In other words, the present embodiments overcome the problem of blue light leakage from the LCD panel that can cause a bluish appearance on one side of the liquid crystal panel. Thus, uniform white light having high color gamut can be obtained from the liquid crystal panel.

Meanwhile, the reflective tape 200 may be attached to partially overlap with the light conversion sheet 150, and an overlap width 'd' of the reflective tape 200 and the light conversion sheet 150 may range from about 1 mm to 2 mm.

Referring back to FIG. 3, the optical sheet 160 may be disposed on the light conversion sheet 150.

The optical sheet 160 may include one or more prism sheets. For example, the optical sheet 160 may include two prism sheets, and here, a lower prism sheet may diffuse light emitted from the light conversion sheet 150 and an upper prism sheet may concentrate light diffused by the underlying prism sheet to emit the same. The concentrated light may be provided to the rear surface of the liquid crystal panel 110.

Meanwhile, the optical sheet 160 may be disposed on an upper portion of the reflective tape 200 in an overlapping manner. Accordingly, in the region where the light conversion sheet 150 and the reflective tape 200 overlap with each other, light is first reflected from the reflective tape 200 before being diffused or concentrated by the optical sheet 160.

Thus, even though the light conversion sheet 150 fails to emit white light due to blue light having high strength emitted from the portion where the light source unit 120 and the light guide plate 130 are adjacent, the leaked portion of the blue light can be first reflected from the reflective tape 200 and be redirected or incident back into the light conversion sheet 150.

The backlight assembly including the light source unit 120, the light guide plate 130, the reflective sheet 140, the light conversion sheet 150, and the optical sheet 160 is received in the bottom cover 170 and fixed by the support main 180. Also, the liquid crystal panel 110 may be mounted on the support main 180.

When a top cover (not shown) is coupled to an upper side of the liquid crystal panel 110 and fastened to the bottom cover 170, the LCD device 100 may be completed.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A backlight assembly comprising:
a light source unit including one or more light emitting diodes (LEDs) mounted on a flexible printed circuit board (FPCB);
a light guide plate disposed to be adjacent to the light source unit and disposed to be in contact with the FPCB in a portion of an upper surface of the light guide plate;
a light conversion sheet disposed on the light guide plate and spaced apart from the FPCB, and configured to convert light other than white light provided through the light guide plate from the light source unit into white light; and
a reflective tape attached to extend from a portion of an upper surface of the FPCB to overlap with a portion of an upper surface of the light conversion sheet.

2. The backlight assembly of claim 1, wherein the reflective tape is attached to overlap with the portion of the upper surface of the light conversion sheet by 1 mm to 2 mm.

3. The backlight assembly of claim 1, wherein the reflective tape comprises a blocking layer and a reflective layer below the blocking layer, and wherein the reflective layer is attached to the upper surface of the FPCB and the light conversion sheet.

4. The backlight assembly of claim 1, wherein light emitted through the light guide plate from the light source unit that is incident on the reflective tape is configured to be reflected from the reflective tape, and the reflected light is incident on an interior of the light guide plate and is subsequently reflected to and emitted through the upper surface of the light conversion sheet.

5. The backlight assembly of claim 1, wherein light emitted through the light guide plate and the light conversion sheet from the light source unit that is incident on the reflective tape is configured to be reflected from the reflective tape, and the reflected light is incident on an interior of the light conversion sheet, is wavelength-converted within the light conversion sheet, and is subsequently emitted through the upper surface of the light conversion sheet.

6. The backlight assembly of claim 1, further comprising:
one or more optical sheets disposed on the light conversion sheet,
wherein the reflective tape is attached between the portion of the upper surface of the light conversion sheet and a portion of the optical sheets.

7. The backlight assembly of claim 1, wherein the one or more LEDs are blue LEDs, and the light conversion sheet wavelength-converts blue light emitted from the blue LEDs into green light and red light, and emits each of the green light, the red light, and the blue light to collectively form white light.

8. The backlight assembly of claim 1, wherein the one or more LEDs are ultraviolet LEDs, and
the light conversion sheet wavelength-converts light emitted from the ultraviolet LEDs into blue light, green light, and red light, and emits each of the blue light, the green light, and the red light to collectively form white light.

9. The backlight assembly of claim 1, further comprising:
a reflective sheet disposed below the light guide plate,
wherein light emitted through the light guide plate from the light source unit and reflected from the reflective tape, is reflected from the reflective sheet and emitted to the light conversion sheet through the light guide plate.

10. A liquid crystal display device comprising:
a liquid crystal panel; and
a backlight assembly disposed below the liquid crystal panel and providing light to the liquid crystal panel,
wherein the backlight assembly comprises:
a light source unit including one or more light emitting diodes (LEDs) mounted on a flexible printed circuit board (FPCB);
a light guide plate disposed to be adjacent to the light source unit and disposed to be in contact with the FPCB in a portion of an upper surface of the light guide plate;
a light conversion sheet disposed on the light guide plate and spaced apart from the FPCB, and configured to convert light other than white light provided through the light guide plate from the light source unit into white light; and
a reflective tape attached to extend from a portion of an upper surface of the FPCB to overlap with a portion of an upper surface of the light conversion sheet.

11. The backlight assembly of claim 1, wherein the reflective tape directly contacts the portion of the upper surface of the light conversion sheet.

12. The backlight assembly of claim 1, wherein the portion of the upper surface of the FPCB and the portion of the upper surface of the light conversion sheet face a same surface of the reflective tape.

13. The liquid crystal display device of claim 10, wherein the reflective tape directly contacts the portion of the upper surface of the light conversion sheet.

14. The liquid crystal display device of claim 10, wherein the portion of the upper surface of the FPCB and the portion of the upper surface of the light conversion sheet face a same surface of the reflective tape.

* * * * *